(12) United States Patent
Leng

(10) Patent No.: US 11,769,722 B2
(45) Date of Patent: Sep. 26, 2023

(54) METHOD OF FORMING A METAL-INSULATOR-METAL (MIM) CAPACITOR

(71) Applicant: Microchip Technology Incorporated, Chandler, AZ (US)

(72) Inventor: Yaojian Leng, Portland, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/992,142

(22) Filed: Nov. 22, 2022

(65) Prior Publication Data

US 2023/0079474 A1   Mar. 16, 2023

Related U.S. Application Data

(62) Division of application No. 16/999,358, filed on Aug. 21, 2020, now Pat. No. 11,545,428.

(Continued)

(51) Int. Cl.
*H01L 23/522* (2006.01)
*H01L 49/02* (2006.01)
(Continued)

(52) U.S. Cl.
CPC ...... *H01L 23/5223* (2013.01); *H01L 21/7687* (2013.01); *H01L 21/76816* (2013.01);
(Continued)

(58) Field of Classification Search
CPC ... H01L 23/5223; H01L 23/5222–5225; H01L 23/53228; H01L 21/7687;
(Continued)

(56) References Cited

U.S. PATENT DOCUMENTS 6,670,237 B1    12/2003    Loh et al. .................... 438/253
2005/0255664 A1    11/2005    Kao et al. .................... 438/396
(Continued)

FOREIGN PATENT DOCUMENTS

JP    2007214284 A    8/2007
JP    2008147300 A    6/2008

OTHER PUBLICATIONS

International Search Report and Written Opinion, Application No. PCT/US2020/047581, 14 pages, dated Nov. 4, 2020.
(Continued)

*Primary Examiner* — Victor A Mandala
*Assistant Examiner* — Lawrence C Tynes, Jr.
(74) *Attorney, Agent, or Firm* — SLAYDEN GRUBERT BEARD PLLC

(57) ABSTRACT

A method of forming a metal-insulator-metal (MIM) capacitor with copper top and bottom plates may begin with a copper interconnect layer (e.g., Cu MTOP) including a copper structure defining the capacitor bottom plate. A passivation region is formed over the bottom plate, and a wide top plate opening is etched in the passivation region, to expose the bottom plate. A dielectric layer is deposited into the top plate opening and onto the exposed bottom plate. Narrow via opening(s) are then etched in the passivation region. The wide top plate opening and narrow via opening(s) are concurrently filled with copper to define a copper top plate and copper via(s) in contact with the bottom plate. A first aluminum bond pad is formed on the copper top plate, and a second aluminum bond pad is formed in contact with the copper via(s) to provide a conductive coupling to the bottom plate.

20 Claims, 14 Drawing Sheets

Related U.S. Application Data

(60) Provisional application No. 62/980,485, filed on Feb. 24, 2020.

(51) Int. Cl.
  *H01L 21/768* (2006.01)
  *H01L 23/00* (2006.01)
  *H01L 23/532* (2006.01)

(52) U.S. Cl.
  CPC .. *H01L 21/76873* (2013.01); *H01L 23/53228* (2013.01); *H01L 24/05* (2013.01); *H01L 24/06* (2013.01); *H01L 28/60* (2013.01); *H01L 23/53238* (2013.01); *H01L 2224/0557* (2013.01); *H01L 2224/05624* (2013.01)

(58) Field of Classification Search
  CPC ... H01L 2224/0508; H01L 2224/05083; H01L 2224/03462; H01L 2224/05147; H01L 28/40–42; H01L 28/60; H01L 2924/19041; H01L 2924/1205; H01L 27/0288; H01L 27/0629–0635; H01L 27/0647–0658; H01L 27/067–0682; H01L 27/0711–0738; H01L 27/0755; H01L 27/0772–0794; H01L 27/0802–0811; H01L 27/101; H01L 27/224; H01G 4/00–40

See application file for complete search history.

(56) References Cited

U.S. PATENT DOCUMENTS

| | | | |
|---|---|---|---|
| 2006/0189069 A1 | 8/2006 | Coolbaugh et al. | 438/243 |
| 2007/0012973 A1 | 1/2007 | Nasu et al. | 257/295 |
| 2014/0159201 A1* | 6/2014 | Keller | H01L 23/5223 257/532 |
| 2014/0183690 A1* | 7/2014 | Lii | H01L 23/585 257/532 |
| 2014/0183693 A1* | 7/2014 | Tsai | H01L 24/05 257/532 |
| 2015/0162397 A1 | 6/2015 | Chiou et al. | 257/529 |
| 2018/0167047 A1 | 6/2018 | Schultz et al. | |
| 2019/0096986 A1 | 3/2019 | Hsu et al. | |

OTHER PUBLICATIONS

German Office Action, Application No. 112020006801.3, 9 pages, dated Jun. 20, 2023.

* cited by examiner

METHOD OF FORMING A METAL-INSULATOR-METAL (MIM) CAPACITOR

RELATED APPLICATIONS

This application is a divisional of U.S. application Ser. No. 16/999,358 filed Aug. 21, 2020, which claims priority to commonly owned U.S. Provisional Patent Application No. 62/980,485 filed Feb. 24, 2020, the entire contents of which applications are hereby incorporated by reference for all purposes.

TECHNICAL FIELD

The present disclosure relates to metal-insulator-metal (MIM) capacitors, and more particularly, to an MIM capacitor having copper top and bottom plates.

BACKGROUND

A metal-insulator-metal (MIM) capacitor is a capacitor constructed with a metal top plate, a metal bottom plate, and an insulator (dielectric) sandwiched between the two metal plates.

MIM capacitors are important components in many electrical circuits, for example many analog, mixed-signal, and radio-frequency complementary metal-oxide semiconductors (RF CMOS) circuits. MIM capacitors typically provide better performance than alternatives, such as POP (Poly-Oxide-Poly) capacitors and MOM (Metal-Oxide-Metal Lateral Flux) capacitors, due to lower resistance, better matching, and/or better signal/noise ratio.

MIM capacitors are typically built just below the top metal layer, for example, using the existing Top-1 Metal layer as the bottom plate; constructing a top plate, typically using a different metal (e.g., Ti/TiN, Ta/TaN, W) or sometimes using the same metal as the Top-1 Metal; and connecting an overlying Top Metal layer to the top and bottom plates of the capacitor through respective vias. The top plate typically has a higher resistance then the bottom plate, e.g., because the top plate may be limited by thickness constraints and/or the material of choice for integration in the relevant IC structure, thus limiting the performance of conventional MIM capacitors.

FIGS. 1A and 1B show two examples of conventional MIM capacitor structures. FIG. 1A shows a conventional MIM capacitor 100A built on an aluminum interconnect. MIM capacitor 100A includes an insulator layer 112A formed between an aluminum bottom plate 114A (Top-1 Metal layer) and a metal top plate 116A (e.g., Ti, TiN, or Al). The Al bottom plate 114A and metal top plate 116A are each connected to a respective contact 120A and 122A (formed in the Top Metal layer) by one or more vias 124A and 126A, e.g., each formed by filling a via opening with tungsten (W) or other suitable metal. Insulator layer 112A may be an SiN layer having a thickness of about 500 Å, for example.

FIG. 1B shows another conventional MIM capacitor 100B built on a copper (Cu) interconnect. MIM capacitor 100B includes an insulator layer 112B formed between a Cu bottom plate 114B (Top-1 Metal layer) and a metal top plate 116B (e.g., Ta, TaN, or TiN). The Cu bottom plate 114B and metal top plate 116B are each connected to a respective contact 120B and 122B (Top Metal layer) by one or more vias 124B and 126B, e.g., each formed by filling a via opening with tungsten or other suitable metal. As with capacitor 100A built on Al interconnect, the insulator layer 112B of capacitor 10B built on Cu interconnect may be an SiN layer having a thickness of about 500 Å, for example. Layer 112B also acts as a dielectric diffusion barrier for the copper of bottom plate 114B.

As used herein, a "via" refers to a conductive via formed by plugging or otherwise depositing a conductive material (e.g., tungsten) in a via opening (or "via hole") having a small diameter or width, e.g., a diameter or width below 1 µm, and thus having a relative large resistance, e.g., a resistance of at least 1 ohm per via. For example, conventional vias (e.g., vias 124A, 126A, 124B, and/or 126B shown in FIGS. 1A and 1B) typically have a small diameter in the range of 0.1 µm to 0.5 µm, and may have a resistance of about 10 ohms/via, for example, especially for vias formed from tungsten or other highly resistive material. Thus, conventional MIM capacitors often include multiple vias (e.g., multiple vias between the top plate and top plate contact and/or multiple vias between the bottom plate and bottom plate contact) to reduce the overall resistance. As used herein, a "via connection" in the context of an MIM capacitor refers to a via extending from a capacitor plate (top plate or bottom plate) to an overlying conductive contact.

In addition, MIM capacitors are typically expensive to build, e.g., as compared with other certain types of capacitors. For example, MIM capacitors typically require additional mask layers and many additional process steps, as compared with POP (Poly-Oxide-Poly) capacitors and MOM (Metal-Oxide-Metal Lateral Flux) capacitors.

There is a need for MIM capacitors that can be manufactured at lower cost, and with improved performance.

SUMMARY

In integrated circuit structures using copper interconnects, the copper interconnects typically terminate at aluminum bond pads, to be fully compatible with legacy packaging. The aluminum bond pads are typically connected to an underlying top metal layer (Cu MTOP layer) by tungsten vias extending vertically through a passivation layer formed over the Cu MTOP layer vias. FIG. 2 is a cross-sectional view showing this conventional structure, wherein a passivation layer 250 is formed over a Cu MTOP layer 252, tungsten vias 254 are formed in etched openings in the passivation layer 250, and Al bond pads 256 are formed on the vias 254.

Certain known metal-insulator-metal (MIM) capacitors utilize tungsten vias to connect the capacitor top plate and/or bottom plate to a respective bond pad or other conductive contact. In contrast, embodiments of the present invention may replace the tungsten vias with copper vias, in the context of a damascene copper technique in which the copper vias (used to connect a copper bottom plate to a bond pad) are formed concurrently with a wide copper top plate.

Some embodiments of the present invention provide a MIM capacitor formed in an integrated circuit structure, wherein the MIM capacitor includes a wide top plate and narrow contact via(s) for contacting an underlying capacitor bottom plate. The wide top plate and narrow bottom plate contact via(s) may be concurrently formed by depositing copper in a wide top plate opening (also referred to as a "tub opening") and one or more narrow contact via openings, e.g., by a single damascene copper deposition. Copper may be used to concurrently fill both the tub-style top plate opening and narrow contact via openings according to a bottom-up fill, or "super fill" process. In contrast, tungsten deposition fills an opening in a conformal manner, and is generally not suitable for filling both a wide or tub-shaped opening and much narrower via openings concurrently, as discussed in more detail below with reference to FIGS. 3A-3C. Thus, the single damascene copper deposition is used to fill both the tub-style top plate opening, and narrow contact via opening(s) according to embodiments of the present invention may thereby replace the tungsten vias used in certain known MIM capacitors.

In one aspect of the invention, a MIM capacitor device includes a copper bottom plate defined by a portion of a copper interconnect layer, a capacitor dielectric layer formed over the copper bottom plate, a copper top plate formed over the capacitor dielectric layer, a top plate bond pad formed directly onto the copper top plate, and a bottom plate bond pad conductively coupled to the bottom plate bond pad by at least one copper via. The bond pads may be formed from aluminum or other suitable material.

In some embodiments, in a horizontal plane extending through the MIM capacitor device, a lateral width of the copper top plate is greater than 1 µm, and a lateral width of each copper via is less than 1 µm. In some embodiment, a lateral width of the copper top plate is greater than 2 µm, and a lateral width of each copper via is less than 1 µm. In some embodiments, a lateral width of the copper top plate is in the range of 1-5 µm, and a lateral width of each copper via is less than 1 µm. In some embodiments, a lateral width of the copper top plate is in the range of 2-3 µm, and a lateral width of each copper via is less than 0.5 µm.

In some embodiments, the copper interconnect layer defining the copper bottom plate comprises a portion of a top-most damascene copper layer of an integrated circuit device.

In some embodiments, the copper top plate and the at least one copper via comprise portions of the same copper layer, e.g., within respective openings of a passivation layer formed over the copper bottom plate.

In some embodiments, the copper top plate and the at least one copper via are formed concurrently.

In some embodiments, the copper top plate is formed over a first region of the copper bottom plate, and the at least one copper via is formed over a second region of the copper bottom plate.

In some embodiments, each of the top plate and the bottom plate has a thickness providing a sheet resistance of less than 100 milliohms per square.

In some embodiments, the capacitor dielectric layer comprises SiN. In some embodiments, the capacitor dielectric layer comprises a SiN layer having a thickness in the range of 400 Å-1000 Å. In some embodiments, the SiN layer thickness is in the range of 400 Å-500 Å.

In some embodiments, the capacitor dielectric layer includes at least one upwardly turning corner at a transition from a laterally-extending bottom region of the capacitor dielectric layer to a vertically-extending sidewall of the capacitor dielectric layer, wherein the at least one upwardly turning corner of the capacitor dielectric layer improves the break-down voltage of the MIM capacitor device.

In some embodiments, the capacitor dielectric layer comprises a laterally-extending bottom region and at least one vertically-extending sidewall extending upwardly from at least one edge of the laterally-extending bottom region, to thereby define a cap-shaped or bowl-shaped capacitor dielectric layer, and the copper top plate is formed in an area defined by the cap-shaped or bowl-shaped capacitor dielectric layer.

Another aspect of the invention provides an integrated circuit device including a plurality of electronic devices and a MIM capacitor device. The MIM capacitor device includes a copper bottom plate defined by a copper structure of the copper interconnect layer, a capacitor dielectric layer formed over the copper bottom plate, a copper top plate formed over the capacitor dielectric layer, a top plate bond pad formed directly onto the copper top plate, and a bottom plate bond pad conductively coupled to the bottom plate bond pad by at least one copper via.

In some embodiments, the copper top plate and the at least one copper via comprise portions of the same copper layer. In some embodiments, the copper top plate and the at least one copper via are formed concurrently.

In some embodiments, the top plate bond pad and the bottom plate bond pad comprise aluminum bond pads.

In some embodiments, the capacitor dielectric layer comprises at least one upwardly turning corner at a transition from a laterally-extending bottom region of the capacitor dielectric layer to a vertically-extending sidewall of the capacitor dielectric layer, wherein the at least one upwardly turning corner of the capacitor dielectric layer improves the break-down voltage of the MIM capacitor device.

Another aspect of the invention provides a method of forming a MIM capacitor. A copper interconnect layer is formed, including a copper region defining a copper bottom plate of the MIM capacitor. A passivation region is formed over the capacitor bottom plate. A top plate opening is etched in the passivation region, thereby exposing a top surface of the copper bottom plate. A capacitor dielectric layer is deposited, which extends into the top plate opening formed in the passivation region and onto the exposed top surface of the copper bottom plate. Bottom plate contact via opening(s) are then etched in the passivation region. Copper may then be deposited to concurrently form (a) a copper top plate in the top plate opening and (b) copper via(s) in the bottom plate contact via opening(s). Finally, a top plate bond pad is formed directly on the copper top plate and a bottom plate bond pad is formed in contact with the copper via(s), wherein the bottom plate bond pad is conductively coupled to the copper bottom plate by the copper via(s).

In some embodiments, the top bond pad and bottom bond pad comprise aluminum bond pads.

In some embodiments, a barrier layer is deposited into the top plate opening and the bottom plate contact via opening(s) prior to depositing the copper to concurrently form the copper top plate and the copper via(s). In one embodiment, organic additives, such as accelerators, suppressors, and/or levelers may be added to a copper plating solution to influence the growth of copper in the top plate opening and the bottom plate contact via opening(s) during the electroplating of copper to concurrently form the copper top plate and the copper via(s).

In some embodiments, the step of forming the copper interconnect layer including the copper region defining the capacitor bottom plate of the MIM capacitor comprises forming a damascene copper layer of an integrated circuit device.

In some embodiments, the capacitor dielectric layer is formed by (a) forming a dielectric layer extending into the top plate opening in the passivation region and onto the exposed top surface of the copper bottom plate, and (b) removing portions of the dielectric layer to define the capacitor dielectric layer comprising a laterally-extending bottom region that transitions to at least one vertically-extending sidewall to define at least one upwardly turning corner of the capacitor dielectric layer, wherein the at least one upwardly turning corner of the capacitor dielectric layer improves the break-down voltage of the MIM capacitor device.

BRIEF DESCRIPTION OF THE FIGURES

A more complete understanding of the present disclosure may be acquired by referring to the following description taken in conjunction with the accompanying drawings wherein.

It should be understood that the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Embodiments of the present invention provide an MIM capacitor and methods of forming an MIM capacitor (along with an integrated circuit device including an MIM capacitor) having a wide copper top plate and a copper bottom plate contacted by narrow copper via(s). The copper top plate and copper via(s) are formed concurrently, by concurrently filing a wide top plate opening (e.g., 2-10 μm width or diameter) and narrow via opening(s) (e.g., 0.1-0.5 μm width or diameter) with copper, e.g., using a single damascene copper deposition. Aluminum (Al) bond pads may be formed over the MIM capacitor, with a first Al bond pad formed on the copper top plate, and a second Al bond plate formed on the copper contact via(s) to provide a conductive contact to the copper bottom plate.

As discussed above, forming copper vias, instead of conventional tungsten vias, allows the wide top plate opening and narrow bottom plate contact via(s) to be formed concurrently (e.g., using a single damascene copper deposition), due to the advantageous fill characteristics of copper for this purpose, as compared with the conventional use of tungsten. For example, as discussed above, deposited tungsten forms a conformal layer, and is thus not effective for concurrently filling wide openings (e.g., >1 μm width or diameter) and narrow openings (e.g., <1 μm width or diameter). In contrast, deposited copper may fill open volumes in a bottom-up manner, and thus may concurrently fill both wide openings and narrow openings effectively.

Figure 3A:
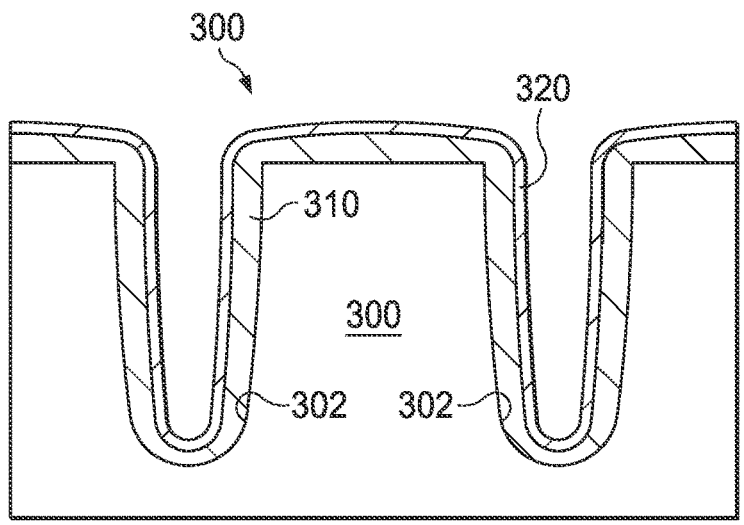
FIGS. 3A-3C are cross-section views of an example semiconductor device structure showing a conventional process of filling via openings with tungsten (W)
Figure 3B:
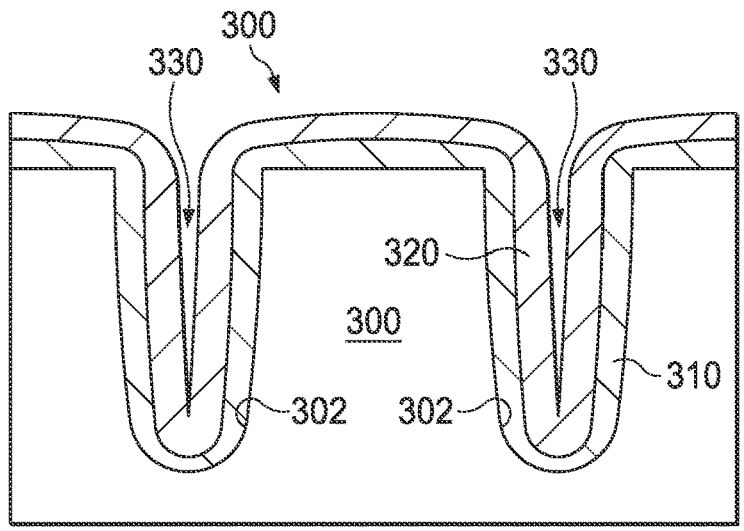
Figure 3C:
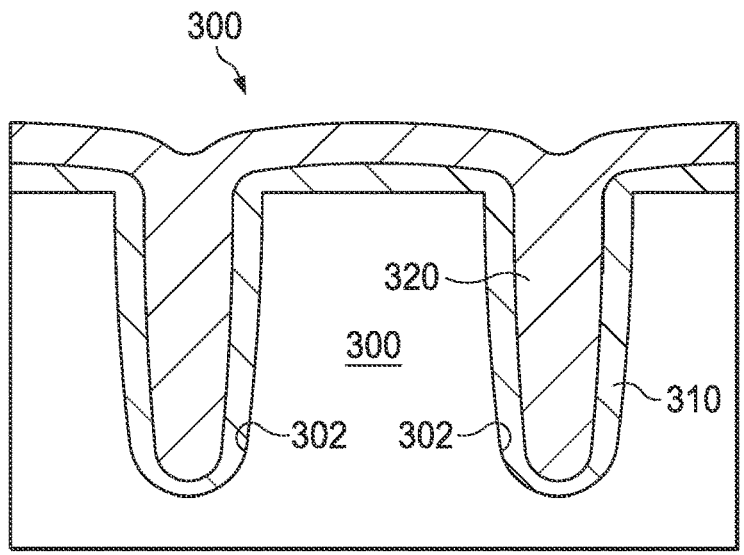

FIGS. 3A-3C are cross-sectional views of an example semiconductor device structure 300 showing a conventional process of filling via openings 302 with tungsten (W) using a tungsten CVD (chemical vapor deposition) process. In a typical semiconductor device structure, each via opening 302 may have a lateral width or diameter in the range of 0.1-0.5 μm. First, as shown in FIG. 3A, a TiN barrier layer 310 is deposited over the structure 300 and extends into each via opening 302. After depositing the barrier layer 310, a tungsten CVD process is started, which forms a thin conformal tungsten layer 320 in the via openings 302. Next, as shown in FIG. 3B, as more tungsten is deposited the conformal tungsten layer 320 in each via opening 302 grows in thickness, i.e., in a radial direction inwardly from the via sidewalls, such that a vertical gap 330 shrinks as the conformal tungsten layer 320 increases in thickness. Finally, as shown in FIG. 3C, the conformal tungsten layer 320 completely fills the via openings 300 and extends fully over the top of the structure 300.

Tungsten CVD such as shown in FIGS. 3A-3C is commonly used to form vias in semiconductor device manufacturing. However, as noted above, tungsten deposition is typically not suitable for larger openings, e.g., due to inherent stress-related characteristics of tungsten. As a conformal tungsten layer reaches a particular thickness, e.g., in the range of 0.5-0.7 μm, it begins to separate or peel from the underlying barrier layer (e.g., TiN layer). In addition, as the tungsten thickness increases, it can create excessive stresses in the semiconductor wafer itself, and may result in wafer breakage in a subsequent process, such as a typical tungsten Chemical-Mechanical Polishing (CMP) process. Thus, in practice, tungsten deposition is typically limited to openings having a width or diameter of less than about 1.0 μm, depending on the particular application.

Figure 4A:
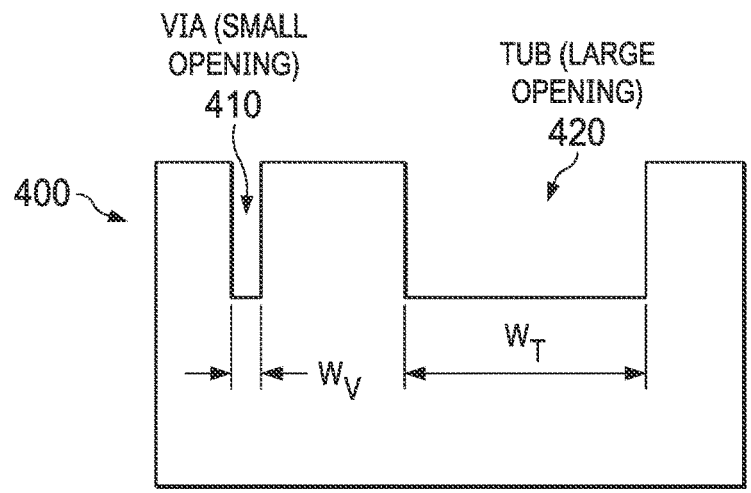
FIGS. 4A-4C are a cross-section views showing an example process of filling both wide and narrow openings in a semiconductor device, and showing the unsuitability of tungsten for such application.
Figure 4B:
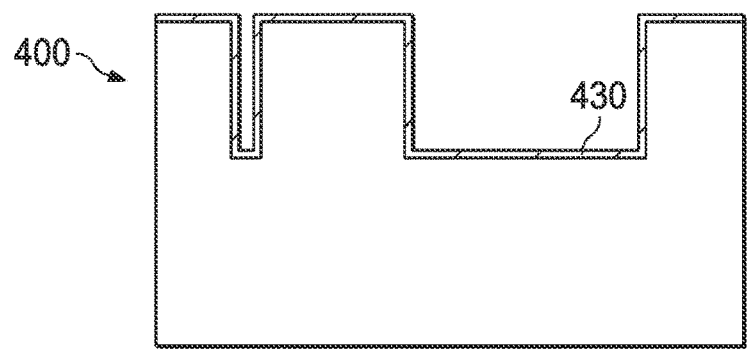
Figure 4C:
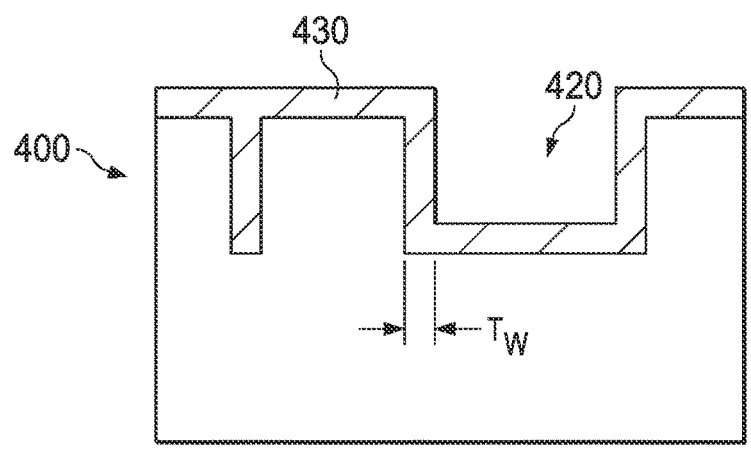

FIGS. 4A-4C provide a series of cross-sectional views of an example semiconductor device structure 400 illustrating the unsuitability of tungsten for a device having both wide and narrow openings, for example a MIM capacitor according to the present invention having a wide top plate opening and narrow via opening(s). As shown in FIG. 4A, semiconductor device structure 400 includes a narrow via opening 410 (e.g., width $W_V$=0.3 μm) and a wide opening or "tub opening" 420 (e.g., width $W_T$=3 μm). A TiN barrier layer (not shown) may be formed over the structure and extending into openings 410 and 420, to thereby coat the exposed surfaces of via and tub openings 410 and 420. Then, as shown in FIG. 4B, a tungsten deposition process (e.g., CVD) may be started, which forms a conformal tungsten layer 430. As shown in FIG. 4C, the thickness $T_W$ of the conformal tungsten layer 430 increases as the tungsten deposition continues. Once the tungsten layer 430 reaches a particular thickness, e.g., $T_W$=0.7 μm, the tungsten layer 430 in the tub opening 420 may peel or separate from the underlying TiN barrier and/or begin to experience or cause stress-related failures. Thus, the tungsten deposition is unable to effectively fill the tub opening 420.

The inventor has conceived of forming an MIM capacitor having a wide top plate opening and narrow via opening(s) by using copper or other metal suitable to fill such openings in a bottom-up manner, e.g., nickel or cobalt, rather than a conformal manner as with tungsten.

As discussed above, forming copper vias, instead of conventional tungsten vias, allows the wide top plate opening and narrow via opening(s) to be formed concurrently (e.g., using a single damascene copper deposition). Deposited copper advantageously may fill open volumes in bottom-up manner, and thus may concurrently fill both wide openings and narrow openings effectively.

Figure 5A:
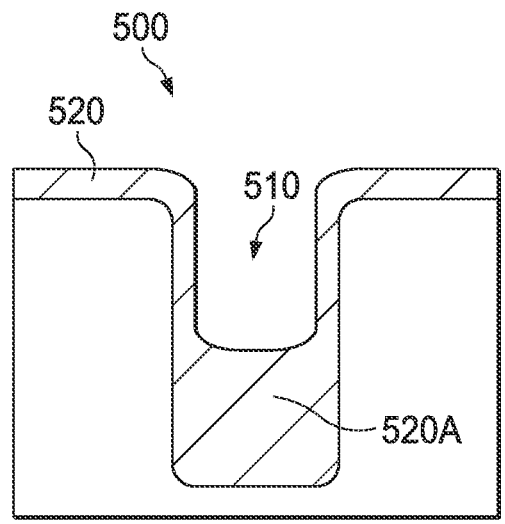
FIGS. 5A and 5B are cross-section views showing an example of a copper fill of a wide "tub" opening in a semiconductor device.
Figure 5B:
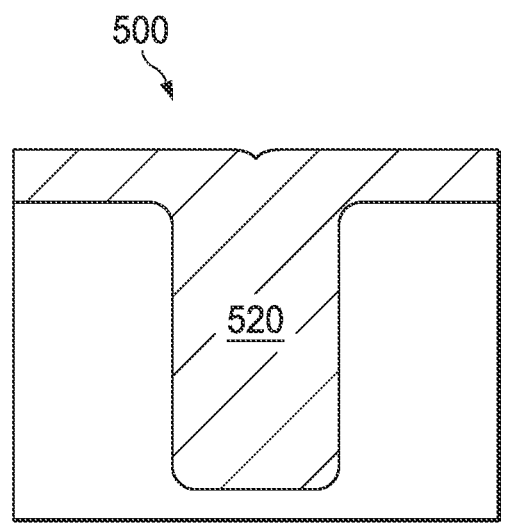

FIGS. 5A and 5B are cross-section views of an example semiconductor device structure 500 showing an example of a copper fill of a wide "tub" opening 510. Tub opening 510 may have a lateral width or diameter greater than 1 µm, for example in the range of 2-10 µm. As shown in FIG. 5A, as copper 520 is deposited, the copper may build up at the bottom of the tub opening 510, as indicated at 520A. This bottom-up fill may continue until tub opening 510 is completely filled with copper 520, as shown in FIG. 5B. The bottom-up manner of filling tub opening 510 may avoid the problems discussed above associated with tungsten deposition.

In some embodiment, the bottom-up filling is achieved by adding organic additives into the electrochemical copper plating solution to suppress the plating rate on the surface of the wafer, while enhancing the plating rate within the openings. In some embodiments, the bottom-up copper fill may be further improved by optimizing the organic additives, such as accelerators, suppressors, and/or levelers, in the copper electrochemical plating solution or plating bath.

Figure 6A:
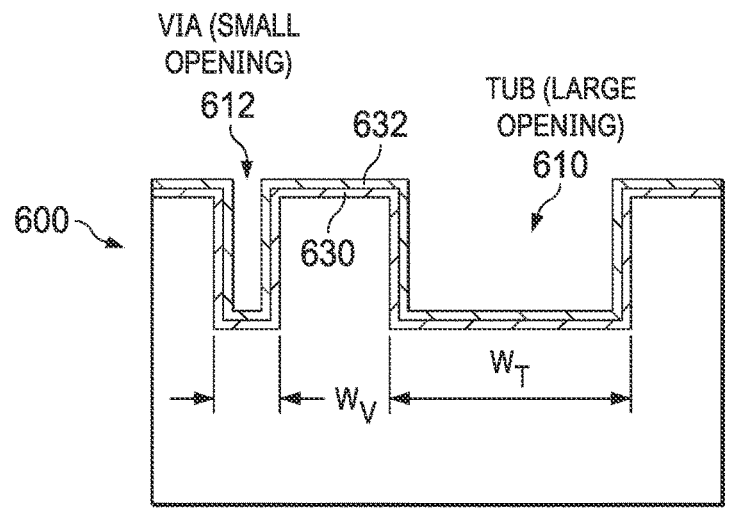
FIGS. 6A-6C are cross-sectional views showing an example process of concurrently filling both wide and narrow openings in a semiconductor device using a copper bottom up fill process, according to embodiments of the present invention.
Figure 6B:
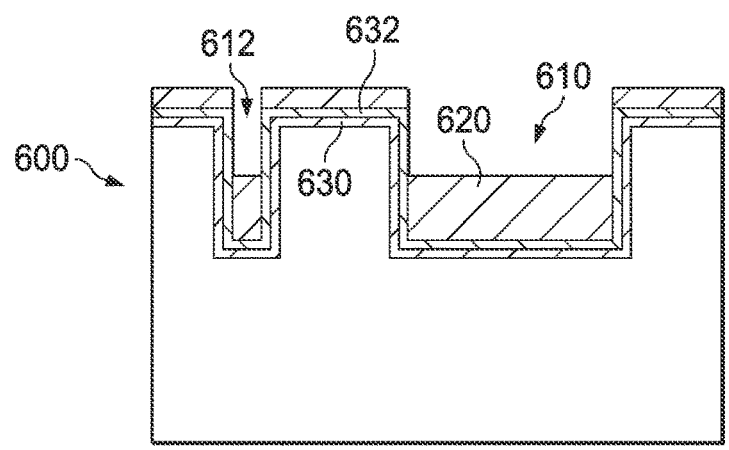
Figure 6C:
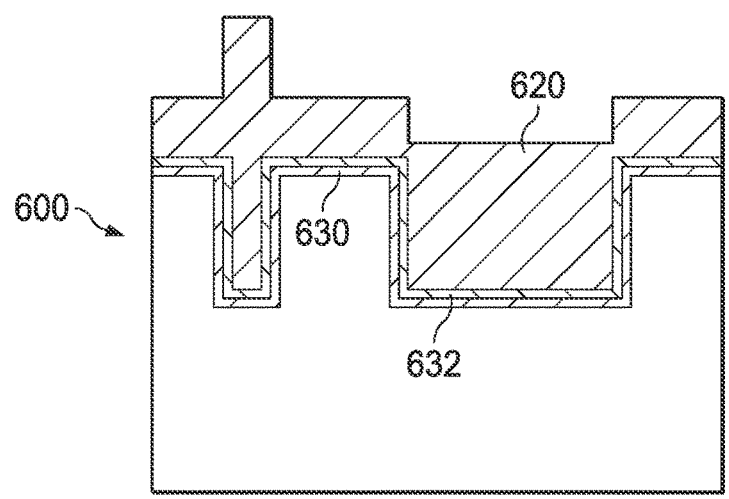

FIGS. 6A-6C provide a series of cross-sectional views illustrating an example process of concurrently filling both wide and narrow openings in a semiconductor device structure 600 using a copper bottom up fill process, e.g., for the construction of a top plate and a bottom plate contact via of a MIM capacitor, according to the present invention. FIGS. 6A-6C generally contrast with FIGS. 4A-4C discussed above, which show the unsuitability of tungsten for filling such openings. As shown in FIG. 6A, semiconductor device structure 600 includes a wide opening or "tub opening" 610 (e.g., width $W_T$=3 µm) and a narrow via opening 612 (e.g., width $W_T$=0.3 µm). In some embodiments, a copper barrier layer 630, followed by a thin seed layer 632, may be formed over the semiconductor device structure 600 and extending into openings 610 and 612, to thereby coat the exposed surfaces of openings 610 and 612. Barrier layer 630 may comprise a TaN/Ta bi-layer or other suitable material(s), and may have a thickness in the range of 100-400 Å. Seed layer 632 may comprise copper or other suitable material(s), and may have a thickness in the range of 600-1200 Å.

Then, as shown in FIG. 6B, a copper deposition process may be started, which begins to fill each opening 610 and 612 with copper 620 in a bottom-up manner. FIG. 6C shows the tub opening 610 and via opening 612 after being completely filled with copper 720. Thus, unlike tungsten, copper is suitable for concurrently filling both narrow and wide openings, e.g., for constructing a top plate and a bottom plate contact via of a MIM capacitor according to the present invention, as discussed in more detail below.

FIGS. 7A-7H illustrate an example process for forming an MIM capacitor including copper top and bottom plates, according to one embodiment of the invention. Each of FIGS. 7A-7H show a cross-sectional view at two locations of an integrated circuit structure 700 under construction, namely a first location (labelled "Bond Pad") at which a first Al bond pad is connected to a copper interconnect layer (e.g., Cu MTOP layer) by copper vias, and a second location (labelled "MIM Capacitor") at which an MIM capacitor having a copper bottom plate defined by the copper interconnect layer (e.g., Cu MTOP layer) and a copper top plate formed over the copper bottom plate, according to the present invention. In the example embodiments discussed below (e.g., in FIGS. 7A-7H and FIG. 8), the copper bottom plate of the MIM capacitor is defined in a top metal layer of a copper interconnect structure, referred to herein as the Cu MTOP layer. In other embodiments, the copper bottom plate of the MIM capacitor may be defined in another copper interconnect layer or other copper layer of an integrated circuit device.

Figure 7A:
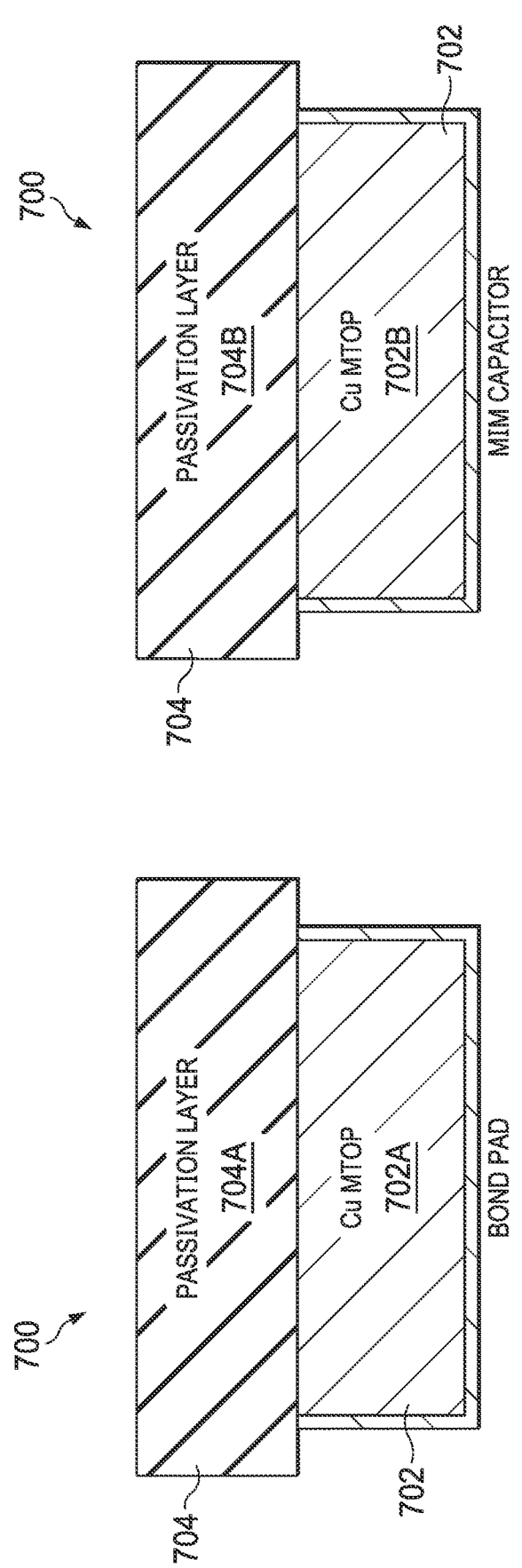
FIGS. 7A-7H are cross-sectional views illustrating an example process for forming an MIM capacitor including copper top and bottom plates, according to one embodiment of the invention.

First, as shown in FIG. 7A, after forming a Cu top metal layer (Cu MTOP layer) 702, which includes a first Cu MTOP structure 702A and a second Cu MTOP structure 702B, a top metal copper chemical mechanical planarization (CMP) is performed, and a passivation region 704 is deposited over Cu MTOP layer 702. The passivation region 704 include a first passivation region portion 704A deposited over the first Cu MTOP structure 702A, and a second passivation region portion 704B deposited over the second Cu MTOP structure 702B. The passivation region 704 is typically a combination of multiple layers of dielectric films configured to protect underlying active integrated circuits. For example, the passivation region 704 may include the following four layers, deposited in the following order: (1) 0.1 um Silicon Nitride, (2) 0.1 um Silicon Rich Oxide (SRO), (3) 0.68 um Phosphorus Silicate Glass (PSG), and (4) 0.58 um Silicon oxynitride (SiON).

Figure 7B:
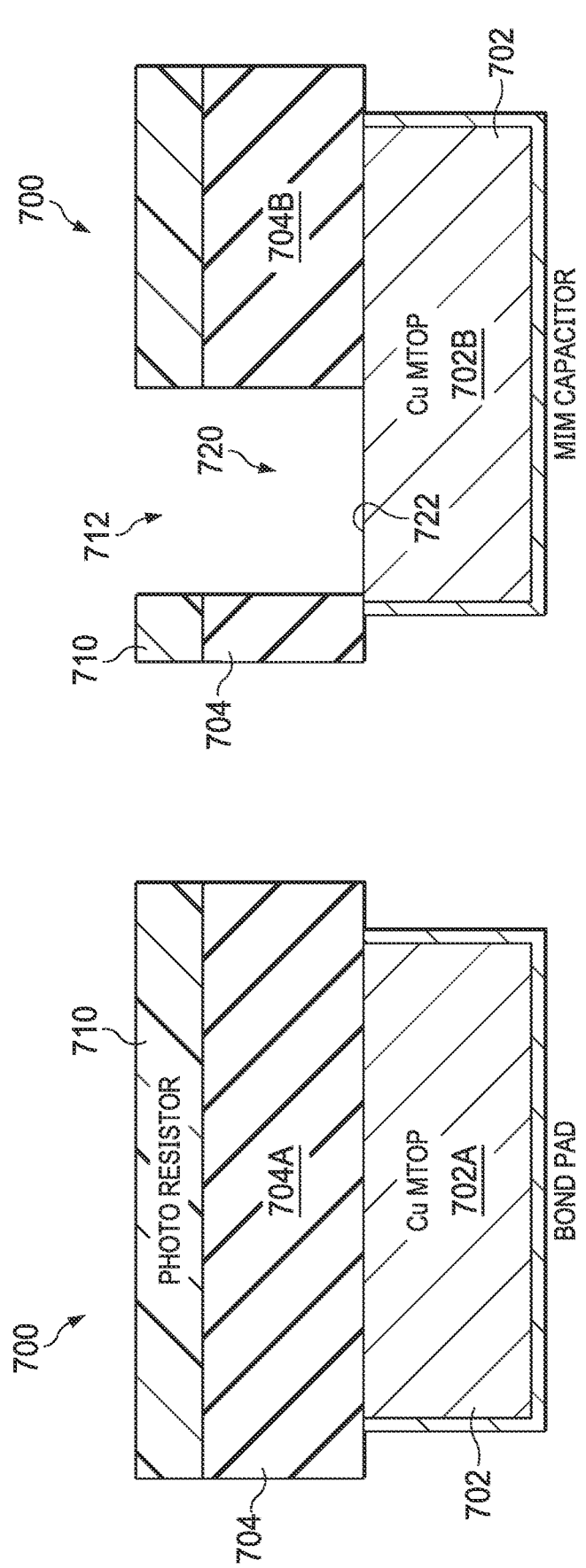

Next, as shown in FIG. 7B, a photoresist layer 710 is deposited over passivation region 704 and patterned to define an opening 712. An etch is them performed through the opening 712 to define a top plate opening 720 in the second passivation region 704B that exposes a top surface area 722 of the second Cu MTOP structure 702B. A resist strip may then be performed to remove remaining portions of the photoresist layer 710.

Figure 7C:
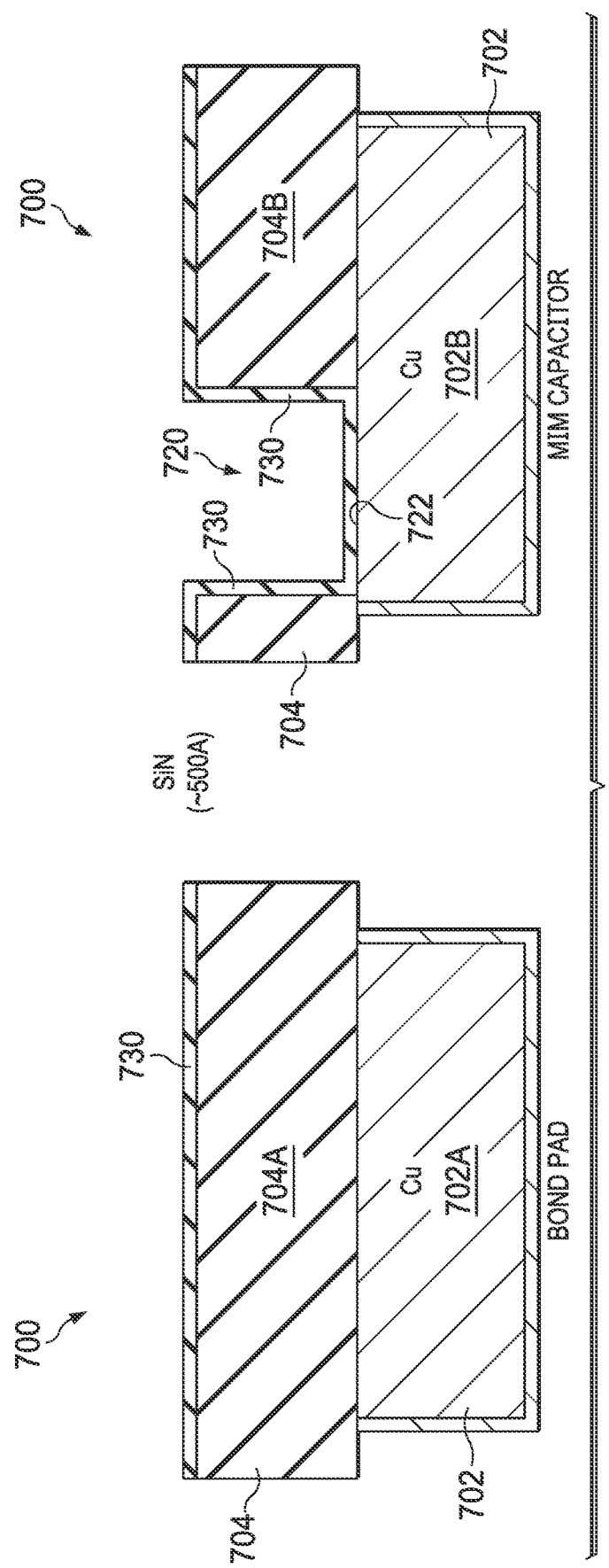

Next, as shown in FIG. 7C, a dielectric layer 730, e.g., an SiN layer, is deposited over the passivation region 704 and extending into the etched top plate opening 720 to cover the exposed top surface area 722 of the second Cu MTOP structure 702B. The dielectric layer 730 (e.g., SiN layer) may have a dual purpose: first, dielectric layer 730 defines the insulator layer in the MIM capacitor being formed; and second, dielectric layer 730 serves as a diffusion barrier for the adjacent copper structures. The deposited dielectric layer 730 may have any suitable thickness for subsequently defining the insulator layer of the MIM capacitor being formed, e.g., a thickness in the range of 200-1000 Å, for example, 300-700 Å, for example, 400-600 Å, or about 500 Å.

Figure 7D:
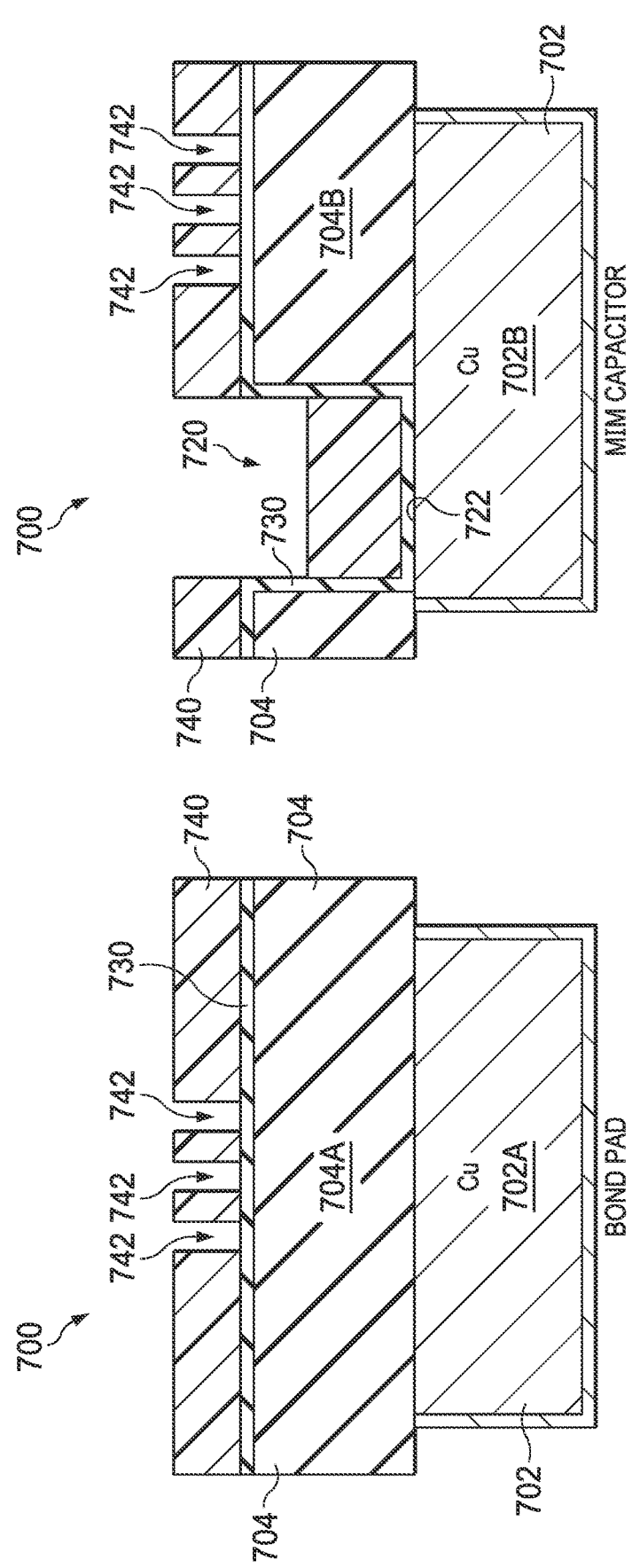
Figure 7E:
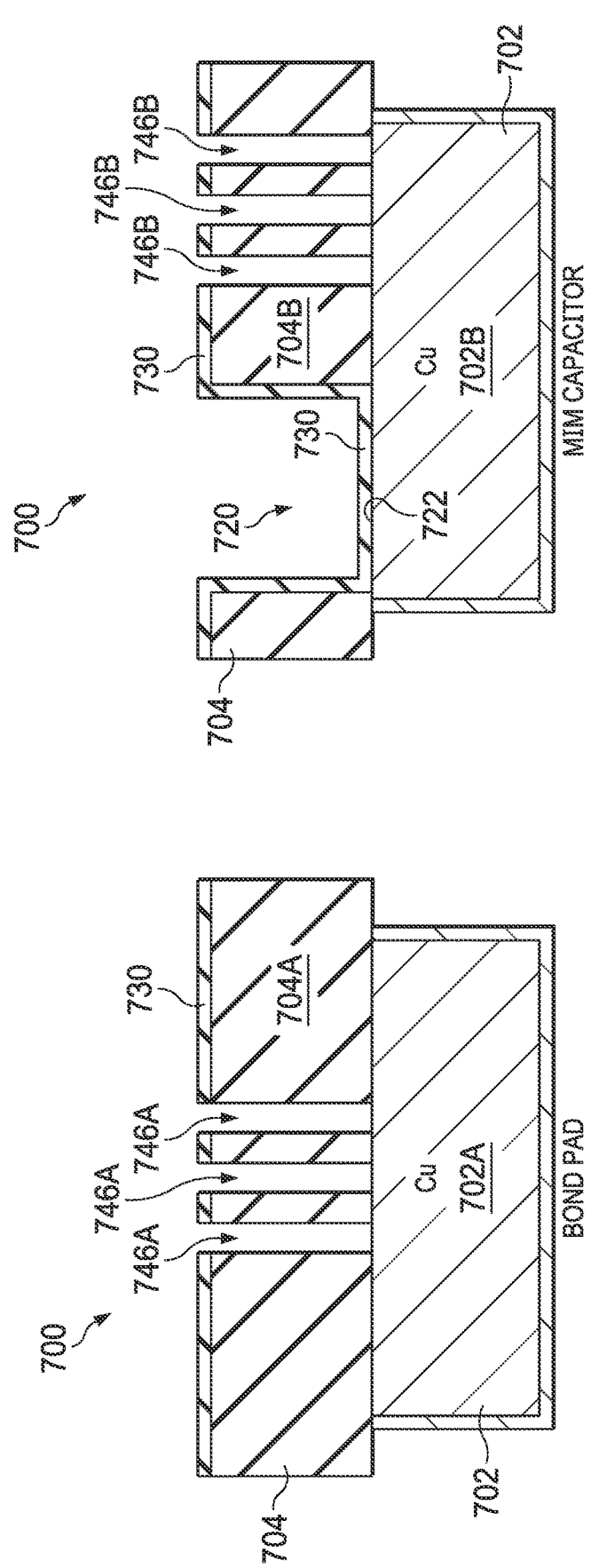

Next, as shown in FIG. 7D, a photoresist layer 740 may be formed and patterned over the structure to define openings 742 for etching vias in the underlying passivation region 704. As shown in FIG. 7E, a via etch may be performed through photoresist layer openings 742 to form via openings extending vertically through both the dielectric layer 730 and passivation layer 704, including (a) via openings 746A for connecting the first Cu MTOP structure 702A to a subsequently formed bond pad (see FIG. 7H, bond pad 770A), and (b) bottom plate contact via openings 746B for connecting the second Cu MTOP structure 702B (i.e., the copper bottom plate) with a subsequently formed bottom plate bond pad (see FIG. 7H, bond pad 770C). A resist strip may then be performed to remove remaining portions of photoresist 740.

The via openings 746A and 746B, along with the top plate opening 720, may then be filled with copper, e.g., using a single damascene copper deposition process, which may include (a) depositing a barrier layer and copper seed layer, (b) performing a copper electrochemical plating, (c) performing a copper anneal, and (d) performing a copper CMP, as discussed below.

Figure 7F:
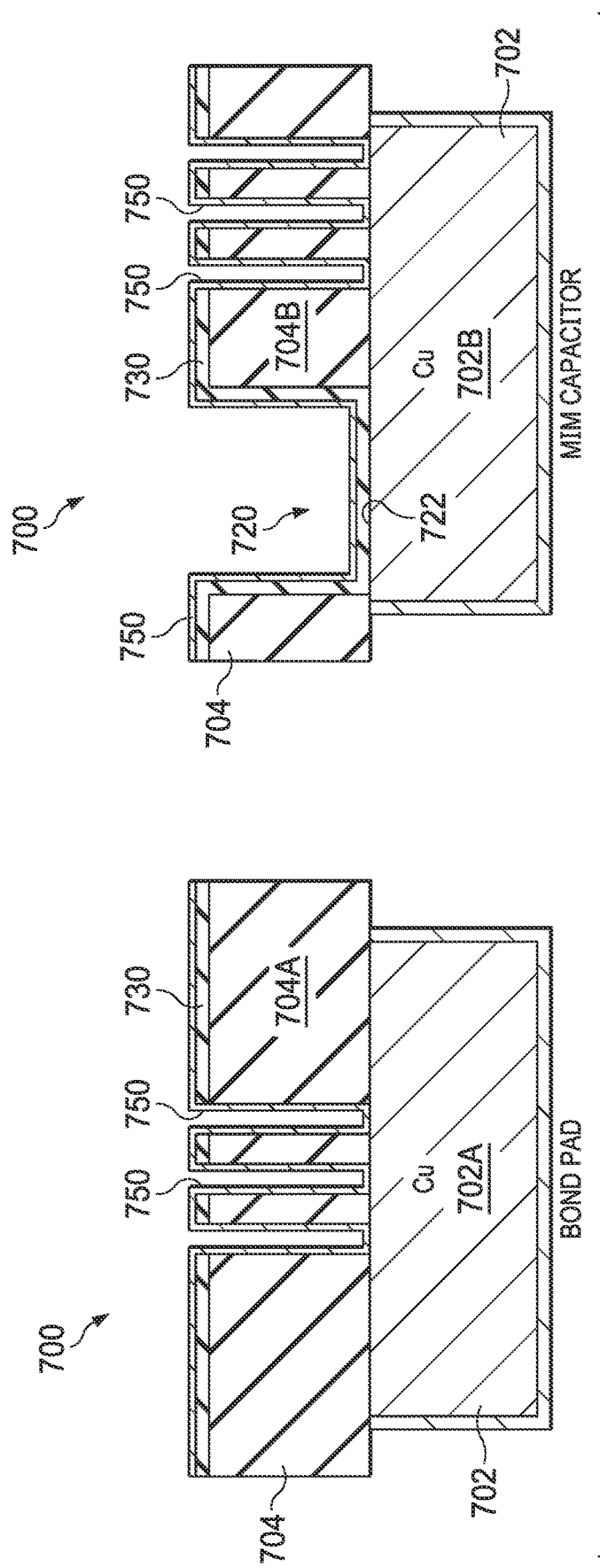
Figure 7G:
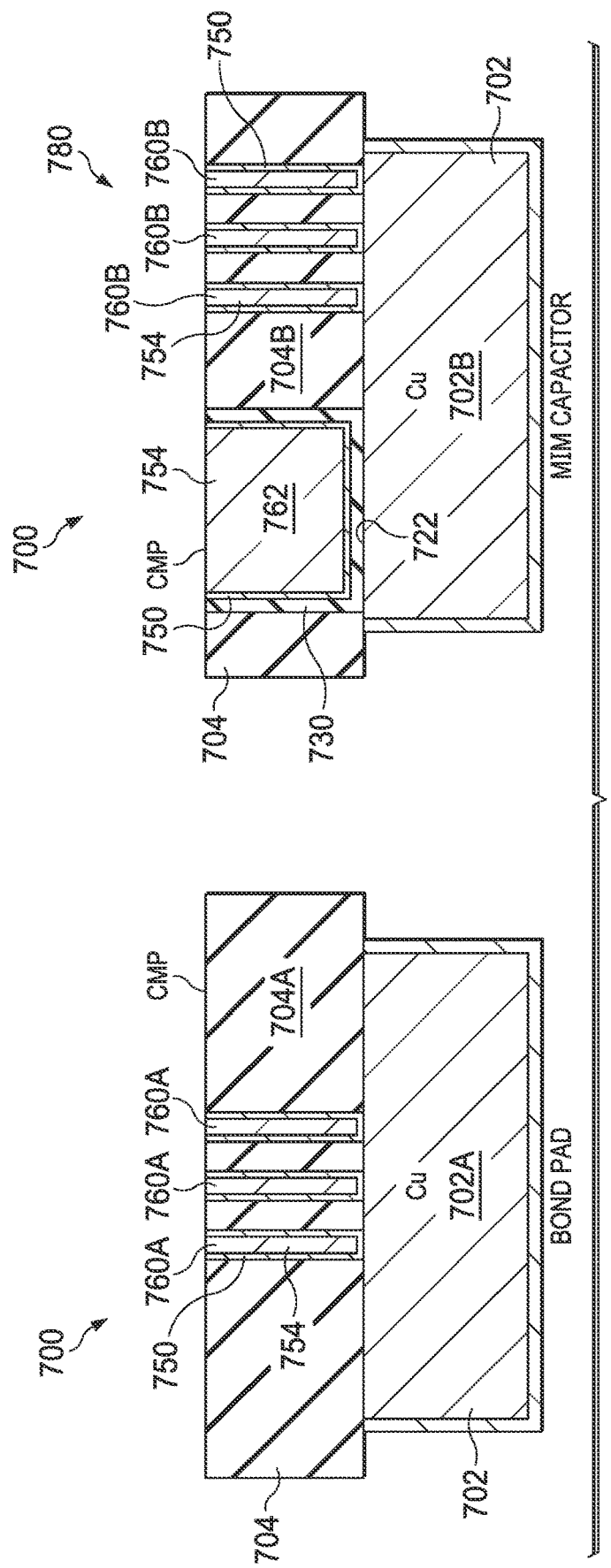

In this example embodiment, a barrier layer and a seed layer are first deposited into the openings, followed by copper electrochemical plating to fill the openings, e.g., as shown in FIGS. 6A-6C discussed above. Accordingly, as shown in FIG. 7F, a barrier layer and seed layer, indicated as a combined 750, are first deposited into via openings 746A, 746B and top plate opening 720. The barrier layer may comprise a TaN/Ta bi-layer or any other suitable barrier layer, and the seed layer may comprise copper or other suitable material. Then, copper 754 is electrochemically plated to fill the openings, as indicated in FIG. 7G. In some embodiments, additives (e.g., accelerators, suppressors, and/or levelers) may be added in the plating solution to enhancement the bottom-up copper fill. The electrochemically plated copper 754 forms vias 760A in via openings 746A, copper bottom plate contact vias 760B in via openings 746B, and copper top plate 762 in top plate opening 720, preferably in a single damascene copper deposition.

Once the bottom plate contact via openings 746B and top plate opening 720 are filled with copper 754 to form copper bottom plate contact vias 760B and copper top plate 762, a MIM capacitor 780 is defined, wherein the second Cu MTOP structure 702B defines the capacitor bottom plate, the copper top plate 762 forms the capacitor top plate, and copper bottom plate 702B is separated from the copper top plate 762 by the dielectric layer 730. The copper bottom plate contact vias 760B are in contact with the copper bottom plate 702B, for connecting the copper bottom plate 702B to an overlying bond pad. The copper top plate 762 may be subsequently contacted by a top plate bond pad formed directly on the copper top plate 762, and the copper bottom plate 702B may be contacted by a bottom plate bond pad conductively coupled to the copper bottom plate 702B by the copper bottom plate contact vias 760B, as discussed below.

In some embodiments, the deposited copper 754 may then be annealed, for example in a furnace for 30-105 min at a temperature of 200° C. A copper CMP (chemical mechanical planarization) may then be performed to planarize the structure at least down to the top surface of the passivation region 704 (or partially into the thickness of passivation region 704), thereby removing upper portions of the deposited copper 754, barrier layer 750, and dielectric layer 730. The resulting structure after the CMP is shown in FIG. 7G.

Figure 7H:
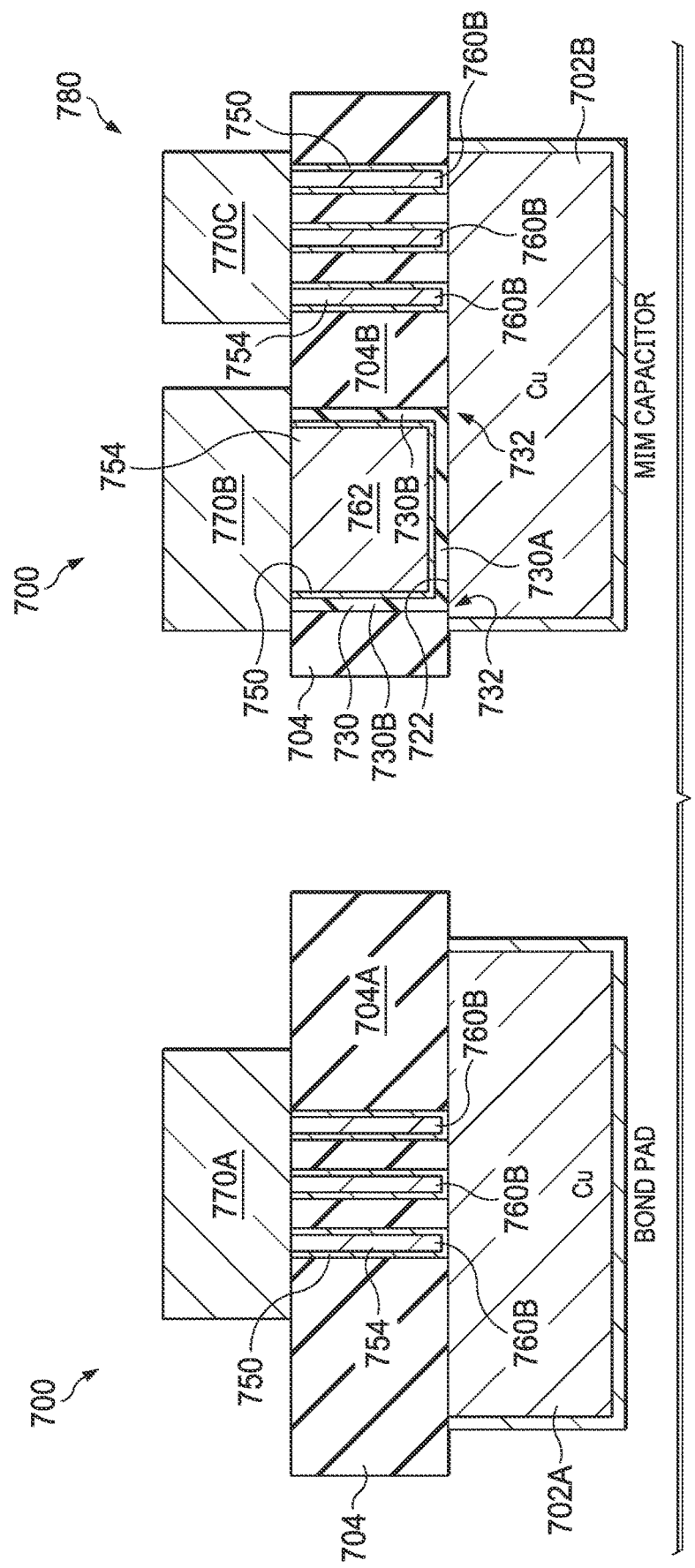

Finally, as shown in FIG. 7H, aluminum bond pads may be formed on top of structure 700 for connecting to the underlying copper structures. For example, an aluminum layer or stack of layers of may deposited over the structure to form the aluminum bond pads. In one embodiment, the aluminum bond pads are formed from an aluminum pad stack that may comprise a three-layer stack including an aluminum layer sandwiched between a pair of Ti/TiN layers. In another embodiment, the aluminum pad stack may comprise an aluminum layer formed over a TaN/Ta layer. In each of these embodiments, the Ti/TiN and/or TaN/Ta layer underneath the aluminum layer provide a copper diffusion barrier.

The deposited aluminum bond pad stack may then be patterned and etched to define (a) a first bond pad 770A formed over copper vias 760A for conductive coupling to the first Cu MTOP structure 702A, and (b) a pair of bond pads for the MIM capacitor 780: in particular, a top plate bond pad 770B formed directly over the copper top plate 762, and a bottom plate bond pad 770C formed over copper vias 760B for conductive coupling to the copper bottom plate 702B.

As shown in FIG. 7H, the dielectric layer 730 (MIM capacitor insulator) formed as described above has a bowl shape or upside-down cap shape including a laterally extending bottom portion 730A and vertically extending sidewall portions 730B extending up from lateral edges of the bottom portion 730A. The transition from the laterally extending bottom portion 730A to each vertically extending sidewall portions 730B define an upwardly turning corner, or "wrap-up corner," of the capacitor dielectric layer, indicated at 732. These wrap-up corners 732 improve the break-down voltage of the MIM capacitor device, due to the corners having an increased electric field.

Figure 8:
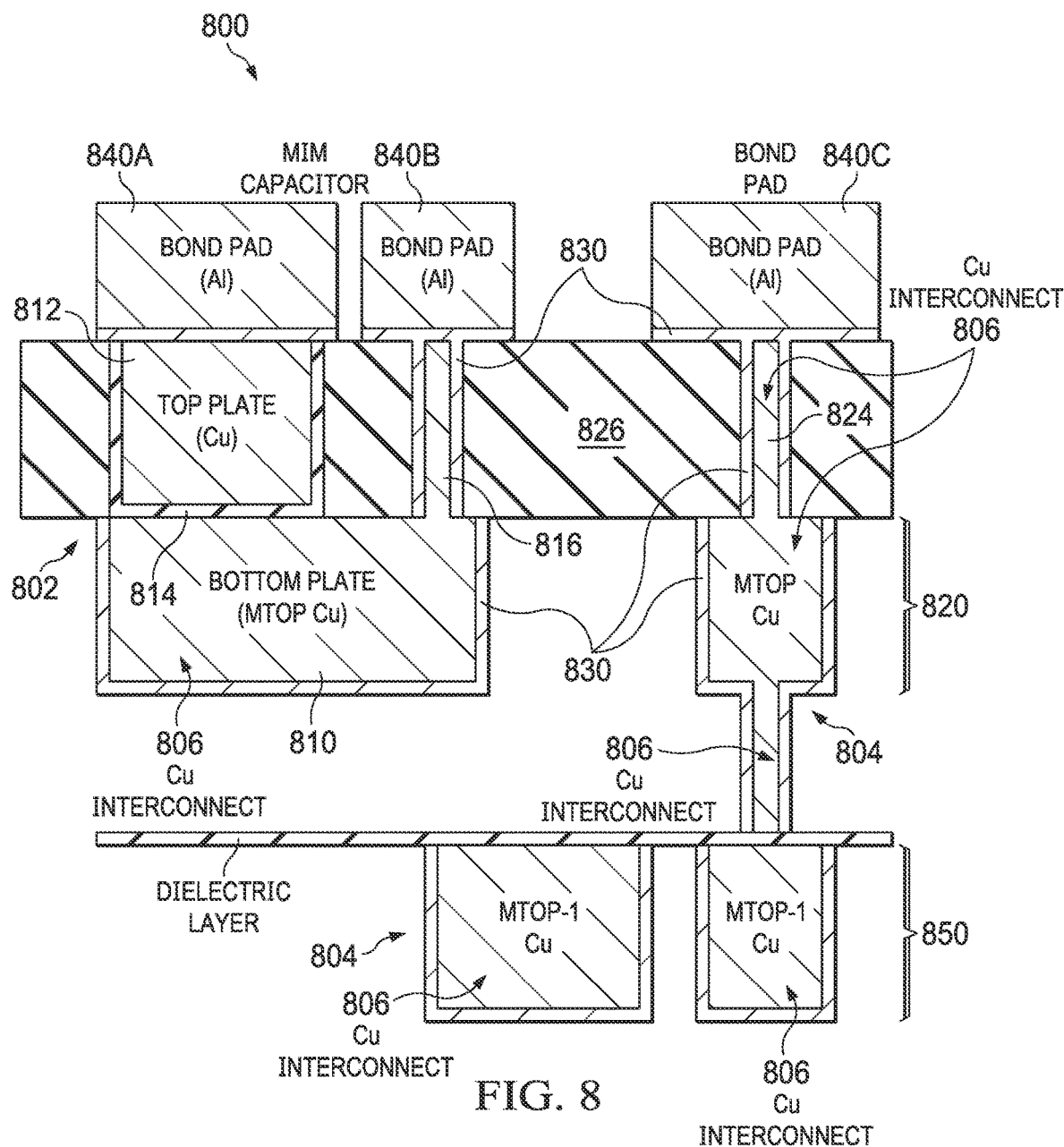
FIG. 8 is a cross-sectional view of an example integrated circuit structure including an MIM capacitor with copper top and bottom plates, according to one example embodiment of the present invention.

FIG. 8 shows an example structure of a portion of an integrated circuit device 800 including an MIM capacitor 802, a copper interconnect structure 806, various other semiconductor circuit elements 804, such as transistors and interconnects, without limitation, according to an example embodiment of the present invention. As discussed above, the bottom plate of MIM capacitor 802, indicated at 810, may be formed by an element of a copper top metal layer (MTOP Cu layer) 820 in which elements of the copper interconnect structure 806 and/or other circuit elements are formed. MIM capacitor 802 includes the copper bottom plate 810 separated from a wide copper top plate 812 by a dielectric insulator (e.g., SiN layer) 814, where the term wide is defined in relation to the width of a via, such as copper vias, 824, 816. A pair of aluminum (Al) bond pads 840A and 840B are formed over the MIM capacitor 802, wherein a first Al bond pad 840A is formed over the with copper top plate 812, and a second Al bond pad 840B is formed over the copper via (or multiple copper vias) 816 in contact with the copper bottom plate 810 to thereby provide conductive contact to the bottom plate 810.

Additional Al bond pad(s) 840C are formed over copper interconnect via(s) 824 of the copper interconnect structure 806, which may extend multiple layers downward into the device structure. FIG. 8 shows a single lower level 850, indicated as a copper MTOP-1 layer, for reference.

In some embodiments, the copper top plate 812 and copper via(s) 816 of the MIM capacitor 802, along with copper interconnect via(s) 824 are formed in a common passivation layer 826 by concurrently filling a wide "tub" opening for the top plate 812 and narrow via openings, using a single damascene copper via process. This concurrent forming of the capacitor top plate and vias may reduce processing steps (and thus time and cost), e.g., as compared with a process in which an MIM capacitor is formed separately from interconnect vias of the respective integrated circuit device. Each copper element, e.g., the MIM capacitor top plate 812, bottom plate 810, and via(s) 816, along with elements of the copper interconnect structure 806, may be formed over a metallic barrier layer (e.g., Ta/Tan) 830 deposited before the respective copper element.

Figure 1A:
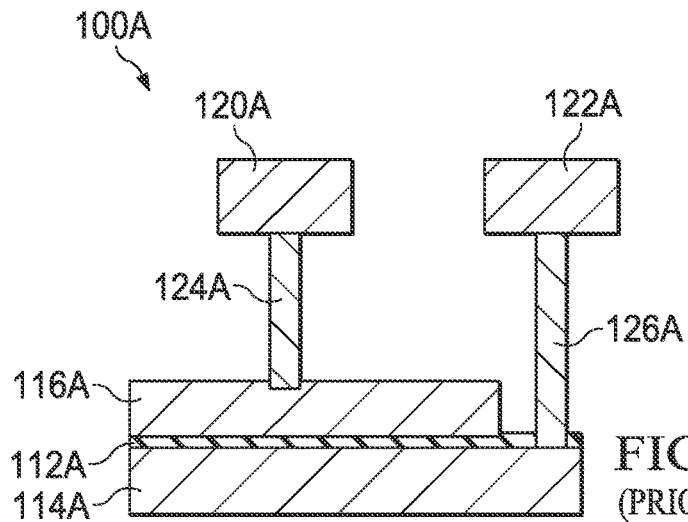
FIG. 1A shows a conventional MIM capacitor built on an aluminum interconnect.
Figure 1B:
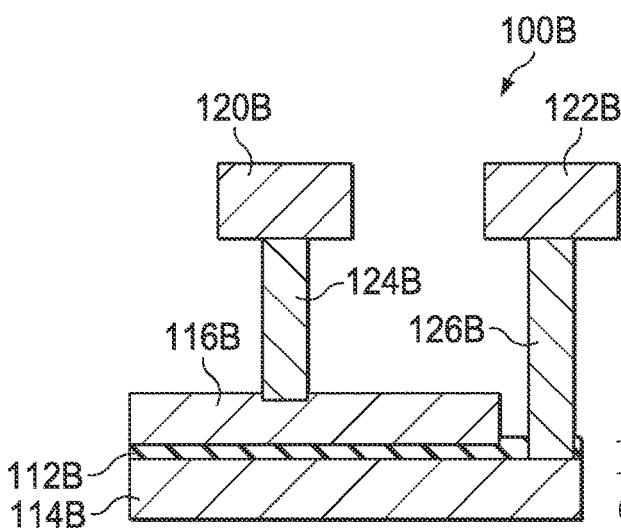
FIG. 1B shows a conventional MIM capacitor built on a copper interconnect.
Figure 2:
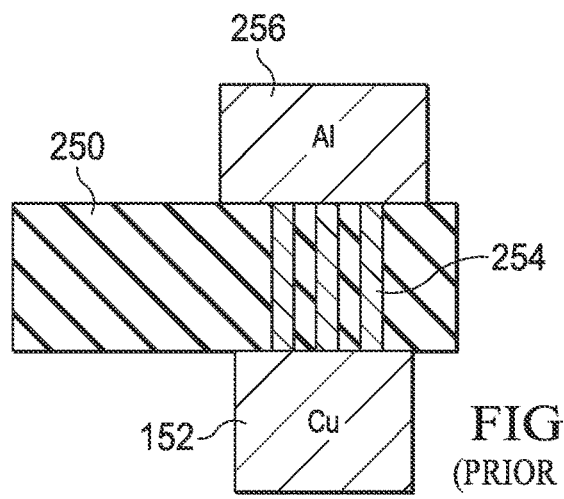
FIG. 2 is a cross-sectional view showing a conventional approach for conductively connecting an Al bond pad to a Cu MTOP layer using tungsten vias extending through a passivation layer.

Using copper for the interconnect vias may allow both the tub style top plate opening and narrow via openings to be filled concurrently by a bottom-up copper fill, as discussed above. This is generally not possible using tungsten, due to the conformal nature of tungsten deposits. Further, both the copper top plate and copper bottom plate of the MIM capacitor 802 may be thick, which may significantly reduce parasitic series resistance and thus the performance of the capacitor, e.g., as compared with capacitors using only via connections to contact both the top and bottom plates (as shown in FIGS. 1A and 1B, for example). In some embodiments, the resistance is limited by sheet resistance of the metal forming each of the copper bottom plates and copper top plates.

In some embodiments, the vertical thickness of the top plate and/or bottom plate is at least 0.3 µm, e.g., in the range of 0.3 µm to 2.0 µm. In some embodiments, the copper top plate 812 may have a diameter or width in the range between 1 µm and 100 µm, e.g., in the range of 1-5 µm. In one example embodiment, the copper top plate 812 may have a diameter or width in the range of 2-3 µm.

In some embodiments, the top plate sheet resistance is below 100 milliohms per square, e.g., in the range of 8-100 milliohms per square, which is substantially lower (e.g., by at least 2 or 3 orders of magnitude) than resistance provided by via connections of conventional designs. Each of the copper top plate 812 and copper bottom plate 812 may have any cross-sectional shape, e.g., square, rectangular, circular, or oval.

The invention claimed is:

1. A method of forming a metal-insulator-metal (MIM) capacitor, comprising:
 forming an interconnect layer including a bottom plate of the MIM capacitor;
 forming a passivation region over the capacitor bottom plate;
 etching a top plate opening in the passivation region, thereby exposing a top surface of the bottom plate;
 forming a dielectric layer extending into the top plate opening formed in the passivation region and onto the exposed top surface of the bottom plate;
 etching at least one bottom plate contact opening in the passivation region;
 depositing metal to concurrently form (a) a top plate of the MIM capacitor in the top plate opening and (b) at least one bottom plate contact in the at least one bottom plate contact opening; and
 forming a top plate connection element on the top plate and a bottom plate connection element in contact with the at least one bottom plate contact, wherein the bottom plate connection element is conductively coupled to the bottom plate by the at least one bottom plate contact.

2. The method of claim 1, wherein:
 a lateral width of the etched top plate opening is greater than 1 µm, and
 each etched bottom plate contact opening comprises a via opening having a lateral width less than 1 µm.

3. The method of claim 1, wherein:
 a lateral width of the etched top plate opening is in the range of 2-10 µm, and
 each etched bottom plate contact opening comprises a via opening having a lateral width less than 1 µm.

4. The method of claim 1, wherein forming the top connection element and the bottom connection element comprises forming aluminum bond pads.

5. The method of claim 1, wherein forming the dielectric layer comprises:
 forming a dielectric layer extending into the top plate opening in the passivation region and onto the exposed top surface of the bottom plate; and
 removing portions of the dielectric layer;
 wherein the dielectric layer comprises a laterally-extending bottom region that transitions to at least one vertically-extending sidewall to define at least one upwardly turning corner of the dielectric layer.

6. The method of claim 1, comprising:
 after depositing the metal to concurrently form the top plate in the top plate opening and the at least one bottom plate contact in the at least one bottom plate contact opening, performing a planarization process to define a planarized top surface of the top plate and at least one planarized top surface of the at least one bottom plate contact; and
 forming the top plate connection element on the planarized top surface of the top plate and forming the bottom plate connection element on the at least one planarized top surface of the at least one bottom plate contact.

7. The method of claim 6, wherein:
 the dielectric layer has a bowl-shape including at least one sidewall portion extending up from a bottom portion;
 the top plate connection element fully covers a top surface of the top plate; and
 the top plate is fully enclosed by the bowl-shaped dielectric layer and the top plate connection element.

8. The method of claim 1, comprising a material removal process including removing upper portions of the dielectric layer, wherein after the material removal process the dielectric layer does not extend laterally outside the top plate opening.

9. The method of claim 1, wherein the top plate connection element is formed directly on the top plate.

10. The method of claim 1, wherein the interconnect layer comprises copper, and the step of depositing metal to concurrently form the top plate and the at least one bottom plate contact comprises depositing copper to concurrently form a copper top plate and at least one copper bottom plate contact.

11. A method of forming a capacitor, comprising:
 forming an interconnect layer including a lower interconnect element and a capacitor bottom plate;
 forming a passivation region over the interconnect element and the capacitor bottom plate;
 etching a top plate opening in the passivation region, thereby exposing a top surface of the capacitor bottom plate;
 etching a top plate opening in the passivation region over the capacitor bottom plate;
 forming a dielectric layer extending into the top plate opening and over the capacitor bottom plate;
 after forming the dielectric layer extending into the top plate opening, etching an interconnect via opening and a bottom plate contact opening in the passivation region; and
 depositing metal to concurrently form (a) an interconnect via in the interconnect via opening, (b) a capacitor top plate of in the top plate opening, and (c) a bottom plate contact in the bottom plate contact opening,
 wherein the interconnect via is conductively connected to the lower interconnect element, and the bottom plate contact is conductively connected to the capacitor bottom plate.

12. The method of claim 11, comprising forming a metal layer including (a) an upper interconnect element conductively connected to the interconnect via, (b) a top plate connection element conductively connected to the capacitor top plate, and (c) a bottom plate connection element conductively connected to the bottom plate contact.

13. The method of claim 12, wherein the upper interconnect element, the top plate connection element, and the bottom plate connection element comprise aluminum bond pads.

14. The method of claim 11, wherein the interconnect layer comprises copper, and the step of depositing metal to concurrently form the interconnect via, the capacitor top plate, and the bottom plate contact comprises depositing copper to concurrently form a copper interconnect via, a copper capacitor top plate, and a copper bottom plate contact.

15. The method of claim 11, comprising:
after depositing the metal to concurrently form the interconnect via, the capacitor top plate, and the bottom plate contact, performing a planarization process to define a planarized top surface of the interconnect via, a planarized top surface of the capacitor top plate and a planarized top surface of the bottom plate contact; and
forming a metal layer including (a) an upper interconnect element formed on the planarized top surface of the interconnect via, (b) a top plate connection element formed on the planarized top surface of the capacitor top plate, and (c) a bottom plate connection element formed on the planarized top surface of the bottom plate contact.

16. The method of claim 11, wherein:
a lateral width of the top plate opening is greater than 1 µm, and
a lateral width of the bottom plate contact opening is less than 1 µm; and
a lateral width of the interconnect via opening is less than 1 µm.

17. The method of claim 16, wherein:
a lateral width of the top plate opening is greater than 1 µm, and
a lateral width of the bottom plate contact opening is less than 1 µm.

18. The method of claim 16, comprising:
after concurrently forming the capacitor top plate and the bottom plate contact, performing a planarization process to define a planarized top surface of the capacitor top plate and a planarized top surface of the bottom plate contact; and
forming the top plate connection element on the planarized top surface of the capacitor top plate and forming the bottom plate connection element on the planarized top surface of the bottom plate contact.

19. The method of claim 16, wherein:
the top plate connection element fully covers a top surface of the capacitor top plate; and
the capacitor top plate is fully enclosed by the bowl-shaped dielectric layer structure and the top plate connection element.

20. A method of forming a capacitor, comprising:
forming a capacitor bottom plate in a lower metal layer;
forming a passivation region over the capacitor bottom plate;
forming a top plate opening in the passivation region, the top plate opening exposing a surface of the capacitor bottom plate;
forming a bowl-shape dielectric layer structure in the top plate opening, the bowl-shape dielectric layer structure including at least one sidewall portion extending up from a bottom portion;
after forming a bowl-shape dielectric layer structure in the top plate opening, forming a bottom plate contact opening in the passivation region;
concurrently forming (a) a capacitor top plate in the top plate opening and (b) a bottom plate contact in the bottom plate contact opening; and
concurrently forming a top plate connection element conductively connected to the capacitor top plate and a bottom plate connection element conductively connected to the bottom plate contact.

* * * * *